(12) United States Patent
Bethke et al.

(10) Patent No.: US 10,110,141 B2
(45) Date of Patent: Oct. 23, 2018

(54) INVERTER WITH A MULTI-PART HOUSING AND AN INTERNAL COOLING-AIR DUCT

(71) Applicant: SMA SOLAR TECHNOLOGY AG, Niestetal (DE)

(72) Inventors: Lars Bethke, Goettingen (DE); Jens Dittmar, Nieste (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 15/625,184

(22) Filed: Jun. 16, 2017

(65) Prior Publication Data
US 2017/0288565 A1  Oct. 5, 2017

Related U.S. Application Data

(63) Continuation of application No. PCT/EP2016/071726, filed on Sep. 14, 2016.

(30) Foreign Application Priority Data

Sep. 14, 2015 (DE) .................... 10 2015 115 421

(51) Int. Cl.
*H02M 7/00* (2006.01)
*H05K 7/20* (2006.01)
(Continued)

(52) U.S. Cl.
CPC ............ *H02M 7/003* (2013.01); *H02M 1/32* (2013.01); *H05K 5/0217* (2013.01); *H05K 7/2039* (2013.01); *H05K 7/20909* (2013.01)

(58) Field of Classification Search
CPC .... H02M 7/003; H02M 1/32; H02M 3/33507; H02M 7/537; H02M 3/00; H02M 3/28;
(Continued)

(56) References Cited

U.S. PATENT DOCUMENTS 6,493,227 B2 * 12/2002 Nielsen .............. H05K 7/20918
165/185
6,580,608 B1 * 6/2003 Searls ................. H01L 23/3675
165/185
(Continued)

FOREIGN PATENT DOCUMENTS

DE  102005031759 A1   1/2007
DE  102013022306 A1   3/2015

OTHER PUBLICATIONS

International Search Report dated Nov. 17, 2016 for International Application PCT/EP2016/071726.
(Continued)

*Primary Examiner* — Adam B Dravininkas
(74) *Attorney, Agent, or Firm* — Eschweiler & Potashnik, LLC (57) ABSTRACT

Embodiments discussed herein include an inverter with a multi-part housing and internal cooling-air duct. In one example, the inverter can comprise a first housing part with direct current connections, a second housing part with alternating current connections, a third housing part for accommodating power-electronics components of a DC voltage converter, a fourth housing part for accommodating power-electronics components of an inverter bridge circuit, and a heat sink. The housing parts each have an essentially planar rear wall and are arranged in such a way that they enclose a cooling-air duct with an essentially rectangular cross section, wherein the first housing part is arranged opposite the second housing part and the third housing part is arranged opposite the fourth housing part. The heat sink has two essentially planar cooling faces opposite one another arranged in the cooling-air duct.

18 Claims, 6 Drawing Sheets

(51) Int. Cl.
*H05K 5/02* (2006.01)
*H02M 1/32* (2007.01)

(58) Field of Classification Search
CPC .. H02M 1/4258; H02M 3/156; H02M 3/3378; H05K 7/1432; H05K 7/20927; H05K 7/209; H05K 2201/09063; H05K 1/165; H05K 2201/086; H05K 1/16; H05K 1/0203; H05K 7/20909; H05K 1/0262; H05K 7/20936; H05K 7/20918; H05K 5/0217; H05K 7/20136; H05K 3/0061; H05K 7/2039
See application file for complete search history.

(56) References Cited

U.S. PATENT DOCUMENTS

| | | | |
|---|---|---|---|
| 8,004,836 B2 * | 8/2011 | Kauranen | H05K 7/20918 165/80.3 |
| 8,520,381 B2 | 8/2013 | Hobein | |
| 2010/0232106 A1 * | 9/2010 | Kauranen | H05K 7/20918 361/692 |
| 2011/0261531 A1 | 10/2011 | Hirashima | |
| 2013/0320896 A1 * | 12/2013 | Sevakivi | H05K 7/2089 318/400.26 |
| 2014/0342087 A1 * | 11/2014 | Diebold | C09C 1/3661 427/213.31 |
| 2015/0342087 A1 | 11/2015 | Donth et al. | |
| 2016/0104658 A1 * | 4/2016 | Bradfield | H02K 9/06 310/58 |

OTHER PUBLICATIONS

English translation of German Office Action dated Apr. 25, 2016 for German Application No. 10 2015 115 421.8.

* cited by examiner

INVERTER WITH A MULTI-PART HOUSING AND AN INTERNAL COOLING-AIR DUCT

CROSS REFERENCE TO RELATED APPLICATIONS

This application claims priority to International Patent Application number PCT/EP2016/071726, filed on Sep. 14, 2016, which claims priority to German Patent Application number 10 2015 115 421.8, filed on Sep. 14, 2015, and is hereby incorporated by reference in its entirety.

FIELD

The disclosure relates to an inverter with a multi-part housing and an internal cooling-air duct.

BACKGROUND

Inverters can convert electrical power of a power-generating unit from direct current into alternating current and feed it into a power supply system, for example an AC voltage supply system, and/or supply it directly to an electrical consumer in order to operate said consumer. In particular, generators which generate electrical power from regenerative sources, for example photovoltaic generators or wind generators, can be used as the power-generator unit here.

A housing of an inverter has to satisfy various requirements. These include, in particular, the provision of connections for direct current lines, alternating current lines and communication lines, the accommodation and cooling of power-electronics components such as switching elements and coiled wire products, as well as the shielding of the electronic components against environmental influences. Furthermore, an inverter is to be constructed in as compact as possible in terms of its external dimensions and its weight, wherein it is to be ensured that its components can be mounted satisfactorily. The specific embodiment of an inverter which satisfies the specified requirements should also be configured in a way which is optimum for costs.

Conventional inverters comprise a housing which is sealed off from the surroundings and has a heat sink at the rear, to which sink the heat-generating components which are arranged within the housing are thermally connected, such that the heat sink can absorb the waste heat from the components and output it to the external air. For example, EP2299582A1 discloses an inverter with a housing, wherein a cooling-air duct having cooling ribs which are oriented in the longitudinal direction of the cooling-air duct runs centrally over the rear side of the housing, and wherein power-electronics components in the housing rest on the inside of an external wall of the housing, which external wall forms a boundary face of the cooling-air duct.

EP455969A1 discloses a safety power supply having a closed housing with forcibly ventilated cooling devices which comprise a ventilation duct which runs in the housing and is separated therefrom in a sealed fashion, wherein the cooling devices comprise at least two heat-sink sections which are electrically isolated from one another and which define the ventilation duct, comprise cooling ribs which project into the ventilation duct and are designed for the separate attachment of heat-outputting components of a primary circuit and of a secondary circuit.

US20110261531A1 describes a switched-mode power supply with a housing in which a coolant duct, through which a coolant flows, runs through the housing, such that electronic components within the housing are cooled by the coolant.

DE102013022306A1 discloses an electric device with a housing, a heat sink and an air-directing part, wherein the air-directing part, the heat sink and the housing form a cooling-air duct, and a cooling-air stream is conducted through the cooling-air duct.

DE102013100607A1 discloses an inverter with a first housing module and a second housing module, in which a cooling-air duct which opens out into the surroundings of the inverter is partially bounded by the first housing module and partially by the second housing module in the circumferential direction.

SUMMARY

The disclosure is directed to an inverter with a multi-part housing, wherein the housing ensures that the lost heat of the power-electronics components is carried away sufficiently and at the same time has compact external dimensions and a low weight, even for a high electrical power rating up to several tens of kilowatts, and can be produced cost-effectively.

An inverter for converting an input-end direct current into an output-end alternating current to be fed into an AC voltage supply system comprises a first housing part with direct current connections for receiving direct current lines of a direct current generator, a second housing part with alternating current connections for receiving alternating current lines of an AC voltage supply system, a third housing part for accommodating power-electronics components of a DC voltage converter, and a fourth housing part for accommodating power-electronics components of an inverter bridge circuit. The housing parts each have an essentially planar rear wall and are arranged in such a way that they enclose a cooling-air duct with an essentially rectangular cross section, wherein the first housing part is arranged opposite the second housing part and the third housing part is arranged opposite the fourth housing part. The inverter comprises a heat sink, which has two essentially planar cooling faces opposite one another arranged in the cooling-air duct, wherein the cooling faces are assigned to the rear walls of the third housing part and the fourth housing part and are in thermal contact with power-electronics components arranged in these housing parts.

An inverter having such a design has compact external dimensions, since the electrical, electronic and electromechanical components which are necessary for the conversion of the input-side direct current into the output-side alternating current are arranged distributed over a plurality of housing parts. As a result of the fact that the heat sink has two cooling faces and is arranged between the third and the fourth housing parts, the power-electronics components of the inverter are each placed on an individual cooling face within the third and the fourth housing part. Said power-electronics components have been found empirically to generate the most lost heat and benefit from the cooling faces being enlarged compared to conventional inverters, wherein at the same time the dimensions of the inverter, i.e. its height, width and depth, can be adapted to one another in an optimum way. In particular the division of the components of the inverter into components of the DC voltage converter and components of the inverter bridge circuit and their distribution among various housing parts on opposite sides of the cooling-air duct makes it possible to construct an inverter with a large power rating which while being larger in a dimension, for example an installation depth, oriented in a normal fashion with respect to the cooling faces, is, however, considerably smaller in the dimensions parallel to the cooling faces, that is to say, for example, its width and height, than a conventionally constructed inverter with a comparable power rating. In addition, installation spaces which are suitable to an optimal degree for accommodating components which generate little or only a negligible amount of lost heat and therefore do not make any requirements, or at least no particular requirements, of its cooling, are available in the first and in the second housing parts. The inverter according to the disclosure provides the further advantage that connection regions for a direct current line and alternating current line can be positioned at easily accessible points so that inverters can be easily and safely put into service.

A two-stage inverter having a DC voltage converter and an inverter bridge circuit generally has a DC voltage intermediate circuit which can be composed of a large number of capacitors, in particular in the case of high power ratings in the region of several tens to several hundreds of kilowatts. In the case of an inverter according to the disclosure, the DC voltage intermediate circuit is, in one embodiment, divided between the third and fourth housing part, i.e. a first part of the DC voltage intermediate circuit is arranged in the third housing part and a second part of the DC voltage intermediate circuit is arranged in the fourth housing part. The first and the second parts of the DC voltage intermediate circuit have, in one embodiment, roughly the same capacitances, with the result that the DC voltage intermediate circuit is divided approximately equally between the third and fourth housing parts. At least approximately a quarter of the capacitance of the DC voltage intermediate circuit is located in one housing part, and three quarters of the capacitance in the other housing part. As a result of this division, the available construction space can be utilized in an optimum way. In addition, as a result of this division, advantages are obtained in terms of the electromagnetic compatibility (EMC) of the inverter. In particular, cable runs from the DC voltage converter to the DC voltage intermediate circuit and then from the DC voltage intermediate circuit to the inverter bridge circuit can be kept very short; particularly on these cable runs, the clocking of switching elements of the DC voltage converter or of the inverter bridge circuit gives rise to high-frequency modulation and therefore potential emission, while a voltage of the DC voltage intermediate circuit and therefore also connecting lines between the parts of the DC voltage intermediate circuit arranged in different housing parts are largely free of high-frequency modulations.

In a further embodiment of the inverter, the first part and the second part of the DC voltage intermediate circuit are connected to one another electrically via intermediate circuit connecting lines which run within a tubular connecting duct between the third housing part and the fourth housing part. In this context, an outer wall of the connecting duct is embodied in an electrically insulating fashion. In one embodiment the connecting duct has at least two partial ducts for accommodating intermediate circuit connecting lines with a positive potential and a negative potential, wherein the partial ducts run axially along the connecting duct and are electrically insulated from one another by means of an axially running dividing wall. Furthermore, the connecting duct can have a third partial duct for accommodating intermediate circuit connecting lines with a center point potential of the DC voltage intermediate circuit, wherein the third partial duct also runs axially along the connecting duct and is electrically insulated from the first and second partial ducts by means of a further axially running dividing wall.

By virtue of the fact that the intermediate circuit connecting lines which run within the connecting duct are electrically insulated, on the one hand, from the housing part and, if appropriate, from the surroundings by the electrically insulating external wall and, on the other hand, from one another by the electrically insulating dividing walls, it is possible to dispense with the insulation of the intermediate circuit connecting lines themselves or it can be reduced to a minimum, wherein the compliance with insulation distances which are possibly required by normative regulations is ensured by the dividing walls. In particular, the intermediate circuit connecting lines can be embodied in a highly flexible fashion and, in particular, each comprise a mesh of electrically conductive wires, so that it is possible to lay the intermediate circuit connecting lines with very tight radii within the third and the fourth housing parts, in order to produce a connection to the parts of the DC voltage intermediate circuit. In concrete terms, for example, after the intermediate circuit connecting lines exit the connecting duct they can bend through 90 degrees or 180 degrees in a very tight space and be attached to a circuit board which accommodates the capacitors of the DC voltage intermediate circuit. As a result, both the mounting of the inverter is simplified and also the available installation space is used to an optimum degree.

The connecting duct can comprise two partial tubes, wherein in each case one partial tube extends into the third housing part and into the fourth housing part. The partial tubes can be mounted separately in the housing parts, with the result that a continuous connecting duct is produced through the assembly of the inverter; alternatively, the partial tubes can also be plugged through the rear walls of the housing parts, from the interior of said housing parts after they have been assembled. This further simplifies the mounting of the inverter.

In one embodiment of the inverter, coiled wire products, which are embodied as filter chokes and/or as storage chokes and are configured for filtering or storing the direct current which is to be converted and/or the alternating current which is to be converted, are arranged in the first housing part and/or in the second housing part. These coiled wire products are generally necessary for the operation of the inverter, take up a significant installation space, and make a significant contribution to the overall weight of the inverter. As a result of their arrangement in the first and second housing parts, a balanced weight distribution can be achieved and the assembly of the inverter is further simplified in that the coiled wire products can take place independently of the mounting of the components of the DC voltage converter and of the inverter bridge circuit which are arranged in the third and fourth housing parts. Since the direct current connections and alternating current connections are also arranged in the first and the second housing parts, a length of lines between the input connections and output connections and the coiled wire products which are generally arranged electrically on the input side of the DC voltage converter and output side of the inverter bridge circuit and which is advantageously short in terms of the EMC can be achieved. Furthermore, it proves advantageous, a direct current circuit breaker is arranged in the first housing part and/or an alternating current circuit breaker is arranged in the second housing part.

In one embodiment of the inverter, the heat sink comprises a single-part or multi-part component which is separate from the housing parts. This component can comprise, in particular, an extruded profile which can be produced easily and cost-effectively. In this context, cooling faces of the heat sink which are opposite one another can be fitted into corresponding cutouts in the rear walls of the third housing part and of the fourth housing part. As a result, components which are to be cooled and which are arranged in the third and fourth housing parts can be mounted directly on the cooling faces without any continuous rear walls of the third or the fourth housing parts impeding the conduction of waste heat with an additional thermal resistance.

Alternatively, the heat sink can be formed by cooling ribs which are arranged on the rear walls of the third housing part and of the fourth housing part which are opposite one another. This also permits optimal thermal contact between the components which are to be cooled, and simplifies the mounting and ensures optimum sealing of the interior spaces of the third and fourth housing parts with respect to the cooling-air duct and therefore with respect to the surroundings.

The inverter can have at least one further heat sink which is arranged on the rear wall of the first housing part or of the second housing part and is configured to cool the coiled wire products which are arranged in the first housing part and/or the coiled wire products which are arranged in the second housing part, and is thermally connected to the cooling-air duct, with the result that the further heat sink absorbs heat from the coiled wire products and outputs said heat to cooling air which flows through the cooling-air duct. As a result, a further cooling face is available within the first and/or second housing parts, which face ensures cooling of the coiled wire products without additional expenditure on mounting and with no, or only small, enlargement of the dimensions of the inverter.

In one embodiment of the inverter, a fan unit, which is configured to generate a stream of cooling air through the cooling duct, can be arranged at one end of the cooling-air duct. As a result, the cooling performance of the heat sink can be considerably increased, and the heat sink for achieving the necessary cooling performance can be made considerably smaller than without a fan unit. The fan unit can be capable of being slid in a direction perpendicular to the axis of the cooling-air duct, and the sliding is blocked in a releasable fashion by a locking device, with the result that the fan unit can be removed from the inverter. As a result, cleaning, maintenance and, if appropriate, repair or exchange of a fan of the fan unit are considerably simplified.

A cover can be arranged on the side of the cooling-air duct which is opposite the fan unit. This cover protects the cooling-air duct against soiling from the surroundings of the inverter and can deflect the cooling-air stream flowing out of the cooling-air duct and therefore prevent any soiling, in particular particles, which leaves the cooling-air duct with the cooling-air stream from dropping back into the cooling-air duct. Furthermore, the cover can divert water which impinges on the outside, in particular rainwater, and conduct it to a suitable point at which it can run away satisfactorily.

In one embodiment of the inverter, a positioning device can be provided on a mounting side of the inverter, wherein the mounting side of the inverter is oriented in a normal fashion with respect to the axis of the cooling-air duct. The positioning device can be configured for positioning the inverter in an upright fashion on an essentially horizontal surface with the result that after the inverter has been mounted, the cooling-air duct is oriented vertically. Therefore, the inverter can be operated as a stand-alone device, as a result of which the positioning and putting into service is considerably simplified, in particular if the inverter has a high power rating in the region of several dozens of kilowatts and a correspondingly high intrinsic weight. The positioning device can alternatively be configured to suspend the inverter from a wall, with the result that after mounting, the mounting side of the inverter is oriented parallel with respect to the wall and the cooling-air duct of the inverter is oriented perpendicularly with respect to the wall.

BRIEF DESCRIPTION OF THE FIGURES

In the text which follows, the disclosure will be explained and described further with reference to example embodiments illustrated in the figures.

DETAILED DESCRIPTION

Figure 1:
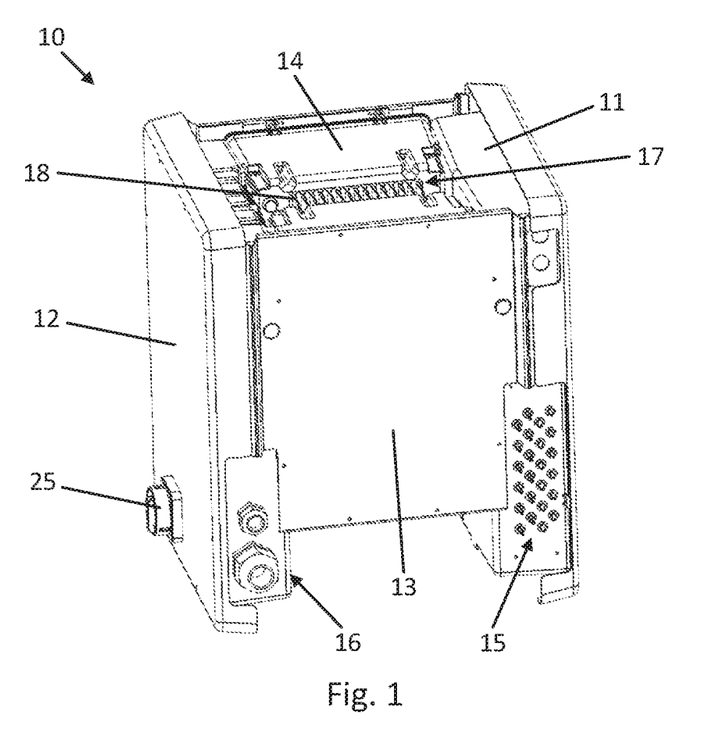
FIG. 1 shows an inverter according to the disclosure with a housing in a mounted state.

FIG. 1 shows an inverter 10 with a housing which comprises a first housing part 11, a second housing part 12, a third housing part 13 and a fourth housing part 14. The housing parts 11 to 14 are each arranged adjacent to one another and as a result form an essentially rectangular arrangement.

The first housing part 11 has direct current connections 15 to which direct current lines of a generator, for example of a photovoltaic generator, can be connected. The direct current connections 15 each comprise, in pairs, connecting plugs which are provided for positive and negative polarity, wherein a generator can be connected to each pair. Further electrical, electronic or electromechanical components (not illustrated here for the sake of clarity), in particular a direct current circuit breaker 24 (see FIG. 6), fuses and overvoltage arrester devices as well as coiled wire products for storing and/or filtering of the direct current to be converted by the inverter 10 can be arranged within the first housing part 11.

The second housing part 12 is arranged opposite the first housing part 11 and is oriented essentially parallel therewith. The second housing part 12 has alternating current connections 16 to which alternating current lines, which can be, in particular, part of an AC voltage system, can be connected, with the result that the inverter 10 can feed an alternating current, generated from the direct current received via the direct current connections 15, into an AC voltage system. Further electrical, electronic or electromechanical components, in particular an alternating current circuit breaker 25 as well as fuses and overvoltage arrester devices (not illustrated here for the sake of clarity), and coiled wire products for storing and/or filtering the alternating current generated by the inverter 10, can be arranged within the second housing part 12.

The third housing part 13 adjoins, with its side faces, the rear sides of the first housing part 11 and of the second housing part 12 and is in this respect arranged between the housing parts 11, 12. At least one DC voltage converter whose components can comprise, in particular, power-electronic semiconductor switches, storage capacitors and actuation electronics (not illustrated here for the sake of clarity) is arranged within the third housing part 13. Depending on the number of connectable generators it is also possible to arrange a plurality of DC voltage converters, in particular connected in parallel, in the third housing part 13.

The fourth housing part 14 is arranged opposite the third housing part 13, essentially oriented parallel therewith and adjoins with its side faces the rear sides of the first housing part 11 and of the second housing part 12 and is in this respect arranged between the housing parts 11, 12. Within the fourth housing part 14, at least one inverter bridge circuit is arranged whose components, which can comprise, in particular, power-electronic semiconductor switches, storage capacitors and actuation electronics, are not illustrated here for the sake of clarity. Depending on the topology selected for the inverter bridge circuit and depending on the overall power to be converted, a plurality of inverter bridges, in particular connected in parallel, can also be arranged in the fourth housing part 14.

In one alternative embodiment, the housing parts 11 to 14 can also be arranged in such a way that the side faces of the first housing part 11 and those of the second housing part 12 adjoin the rear sides of the third housing part 13 and/or of the fourth housing part 14, with the result that the first housing part 11 and/or the second housing part 12 are arranged between the third housing part 13 and the fourth housing part 14.

The housing parts 11 to 14 are arranged in such a way that a cooling-air duct 17 with an essentially rectangular cross section is formed by their rear walls. A heat sink 18 is arranged within this cooling-air duct 17. At least some of the power-electronics components which are arranged in the third housing part 13 and the fourth housing part 14, in particular those which generate significant lost heat during operation and therefore require extended cooling, are arranged in these housing parts 13 and 14 in such a way that they are in thermal contact with the heat sink 18, with the result that the lost heat generated by these power-electronics components can be output to the surroundings via the heat sink 18.

Figure 2:
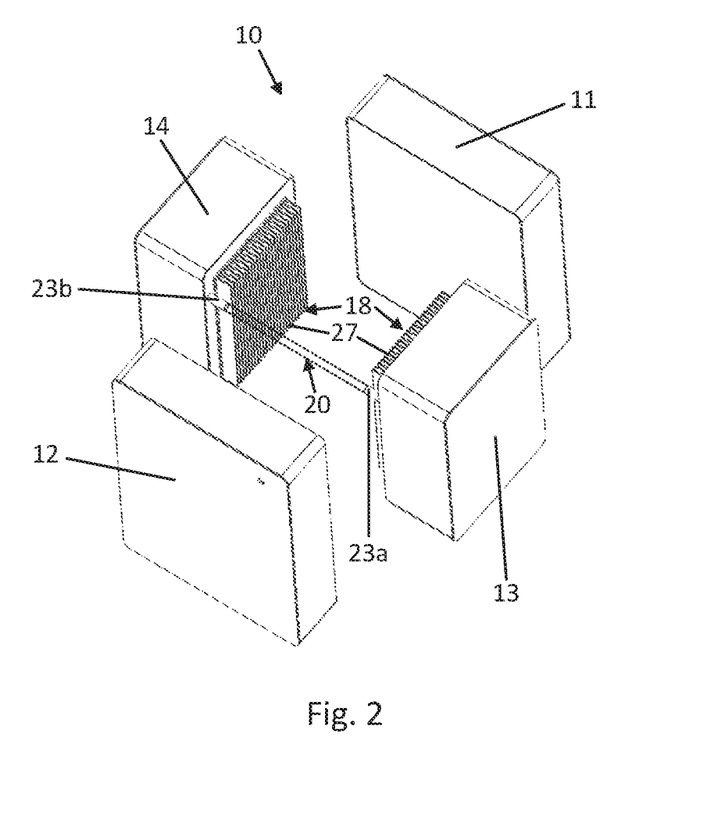
FIG. 2 shows an inverter according to the disclosure with a housing in an exploded illustration.

FIG. 2 shows an embodiment of an inverter 10 according to the disclosure in an exploded illustration. The housing parts 11 to 14 are illustrated in a simplified form here and spaced apart from one another, such as can occur, for example, before the assembly of the inverter 10. The heat sink 18 is formed by cooling ribs 27 which are arranged on the rear sides of the third housing part 13 and of the fourth housing part 14. After the assembly of the inverter 10, the cooling ribs which are opposite one another can be spaced apart from one another, abut one another or overlap.

In order to operate the inverter 10 which has a DC voltage converter and an inverter bridge, a DC voltage intermediate circuit is generally necessary which can comprise a number of capacitors, depending on the power rating of the inverter 10. The capacitors of the DC voltage intermediate circuit can be arranged either in the third housing part 13 or in the fourth housing part 14 or divided between the housing parts 13 and 14.

The inverter 10 has a connecting duct 20 which is composed here, for example, from two partial tubes 23a, 23b, wherein the connecting duct 20 itself is indicated in FIG. 2 by a dashed connection of the partial tubes 23a, 23b, and these partial tubes 23a, 23b abut or overlap one another or are plugged one into the other after the assembly of the inverter 10. This connecting duct 20 is provided for receiving intermediate circuit connecting lines 23c which connect a first part 13d of a DC voltage intermediate circuit arranged in the third housing part 13 to a second part 14d of the DC voltage intermediate circuit arranged in the fourth housing part 14. Details of an example design of the connecting duct 20 are disclosed in conjunction with FIGS. 4a and 4b.

Figure 3:
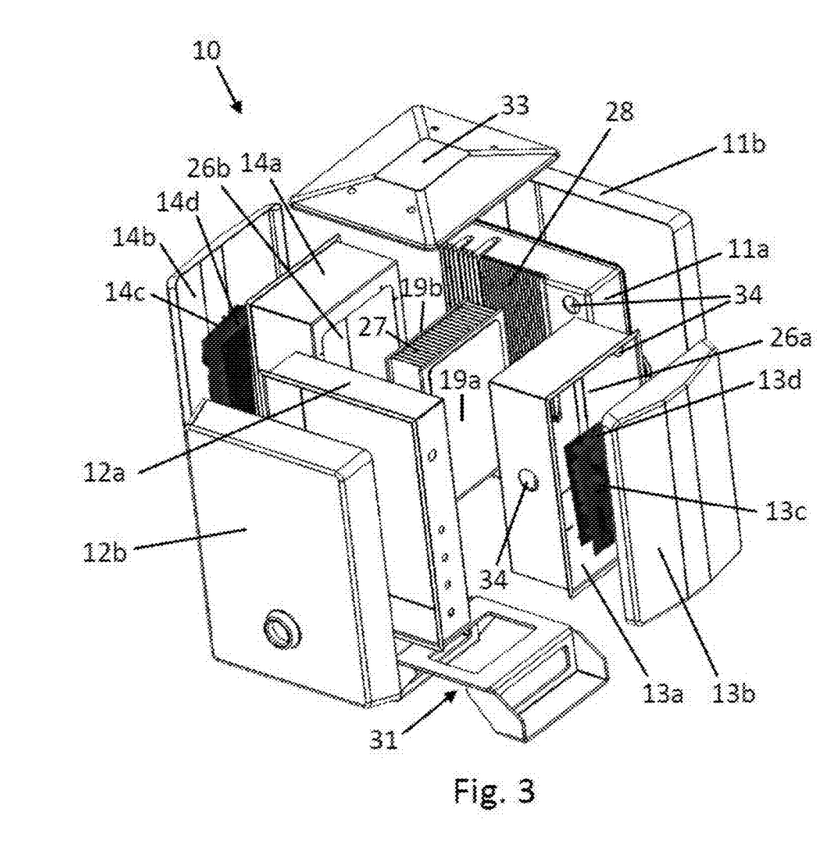
FIG. 3 shows a further exploded illustration of an inverter according to the disclosure.

FIG. 3 shows a further embodiment of an inverter 10 according to the disclosure in an exploded illustration. The housing parts 11 to 14 each comprise here base bodies 11a, 12a, 13a, 14a and associated covers 11b, 12b, 13b, 14b. The housing part 13 accommodates power-electronics components 13c of a DC voltage converter and a first part 13d of a DC voltage intermediate circuit, and the housing part 14 accommodates power-electronics components 14c of an inverter bridge circuit and a second part 14d of the DC voltage intermediate circuit. The heat sink 18 is embodied in this embodiment as a separate, single-piece component and can be produced, for example, in the form of an extruded profile. Alternatively, the heat sink 18 can also be composed of a plurality of parts, in particular of two extruded profiles which are opposite one another. Other production methods such as, for example, pressure die casting are also conceivable. The heat sink 18 has two cooling faces 19a, 19b which are each connected to the cooling ribs 27. The base bodies 13a, 14a of the third housing part 13 and of the fourth housing part 14 have cutouts 26a, 26b whose contour are embodied in such a way that the cooling face 19a tightly closes off the rear wall of the base body 13a, and the cooling face 19b tightly closes off the rear wall of the base body 14a. The cooling-air duct 17 (not denoted in FIG. 3) is therefore formed by the cooling faces 19a, 19b and the rear walls of the base bodies 11a, 12a. In addition, the base body 11a of the first housing part 11 optionally has a further heat sink 28 which is embodied here for example as cooling ribs which are integrated into the rear wall of the base body 11a. Alternatively, the heat sink 28 can be embodied as a separate component which can be attached to the rear wall of the base body 11a or fitted into a cutout in this rear wall.

The inverter 10 according to FIG. 3 has a positioning device 31 which is arranged on a mounting side of the inverter 10, wherein the mounting side of the inverter 10 is located at one end of the cooling-air duct 17 and is oriented in a normal fashion with respect to the axis of the cooling-air duct 17. The positioning device 31 according to FIG. 3 is embodied as a supporting foot, with the result that the inverter 10 can be positioned on an essentially planar surface, with the result that a cooling-air stream flows through the heat sink 18 in the vertical direction and flows past the further heat sink 28. If forced ventilation is provided, which can comprise, in particular, a fan unit 29 according to FIG. 6, the direction of flow can optionally be set from bottom to top or from top to bottom.

A cover 33 which covers the cooling-air duct 17 and protects it against soiling is provided as an upper termination of the cooling-air duct 17. The cooling-air stream which leaves the cooling-air duct 17 can be deflected by the cover, thus preventing, in particular, any soiling, e.g. particles, which leaves the cooling-air duct 17 with the cooling-air stream from dropping back into the cooling-air duct 17. Moreover, the cover 33 can divert water impinging from the outside, in particular rainwater, and conduct it to a suitable point at which it can run away without difficulty.

The base bodies 11a, 12a, 13a, 14a can have openings 34 at their rear walls and/or side walls, through which openings 34 cable connections for connecting the electrical, electronic or electromechanical components which are arranged in the housing parts 11 to 14 can be guided between the housing parts 11 to 14. For this purpose, the openings 34 are arranged in such a way that an opening 34 in one of the base bodies 11a, 12a, 13a, 14a coincides spatially in each case with an opening 34 in one of the respectively adjoining base bodies 11a, 12a, 13a, 14a, with the result that the through-opening which is produced can be sealed by means of suitable seals.

Figure 4A:
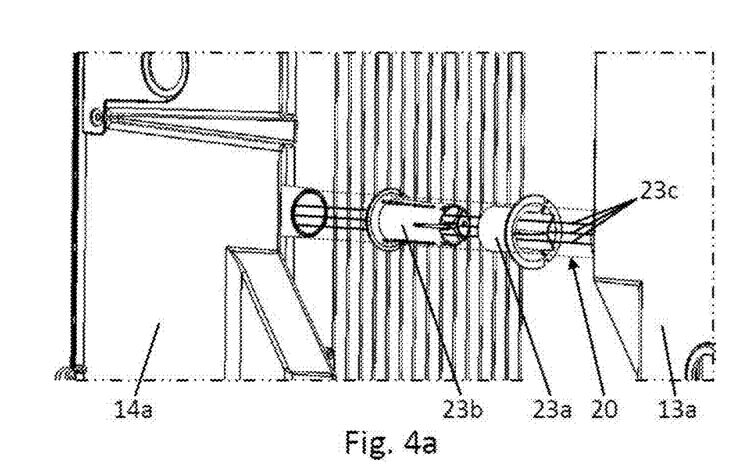
FIG. 4a shows a view of a detail of a connecting duct between housing parts of an inverter according to the disclosure in an exploded illustration.

FIG. 4a shows a view of a detail of an embodiment of the connecting duct 20 which has already been explained in conjunction with FIG. 2 and is not illustrated in FIG. 3 for the sake of clarity. The connecting duct 20 runs between the rear walls of the base bodies 13a and 14a of the third housing part 13 and of the fourth housing part 14 and is composed in this embodiment of two partial tubes 23a, 23b which, after the assembly of the inverter 10, are plugged one into the other. Alternatively, the partial tubes 23a, 23b abut one another after the assembly of the inverter 10, and an additional seal can be provided at the joint between the partial tubes 23a, 23b.

After the assembly of the inverter 10, the partial tube 23a extends into the third housing part 13, and the partial tube 23b extends into the fourth housing part 14, with the result that, in particular, intermediate circuit connecting lines 23c can run in the connecting duct 20 formed by the partial tubes 23a, 23b, in order to connect to one another the parts of the DC voltage intermediate circuit of the inverter 10 which are arranged in the housing parts 13 and 14.

Figure 4B:
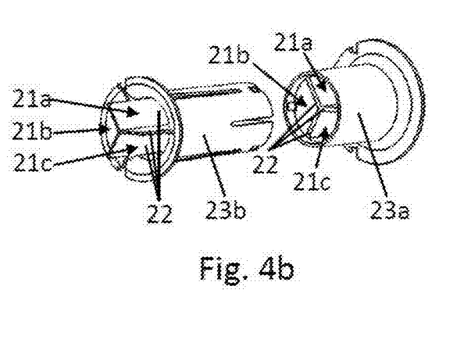
FIG. 4b shows a view of a detail of the connecting duct in an exploded illustration.

FIG. 4b shows a further view of a detail of the partial tubes 23a, 23b. The partial tubes 23a, 23b have partial ducts 21a, 21b, 21c, respectively, which are separated from one another by dividing walls 22. The external walls of the partial tubes and the dividing walls 22 can have electrically insulating properties, with the result that intermediate circuit connecting lines 23c which run within the partial ducts 21a, 21b, 21c are electrically insulated both with respect to one another and also in each case with respect to the base bodies 13a, 14a of the third housing part 13 and of the fourth housing part 14 (cf. FIG. 4a). As a result, it is possible to dispense with separate insulation of the intermediate circuit connecting lines 23c, and it is possible to use essentially non-insulated conductors which have, when viewed in themselves, no sufficient insulation with respect to one another or with respect to electrically conductive housing parts. In particular, braided wires can be used as intermediate circuit connecting lines 23c. Such braided wires, which are composed of a mesh of individual wires or stranded conductors, have a high degree of flexibility and can be laid with tight radii without the individual stranded conductors fanning out.

In order to connect to one another the parts of the DC voltage intermediate circuit which are arranged in the housing parts 13 and 14, at least two intermediate circuit connecting lines 23c are required, i.e. in each case one for the positive pole and one for the negative pole of the overall intermediate circuit formed by the connection. These at least two intermediate circuit connecting lines 23c can be arranged in the partial ducts 21a and 21b. The partial duct 21c, if one is present, can receive a further intermediate circuit connecting line 23c which connects any center point potentials of the parts of the DC voltage intermediate circuit. Moreover, further lines, for example for supplying the on-board power system or else for transmitting control signals or communication signals can be arranged in the partial duct 21c or in further partial ducts.

Figure 5:
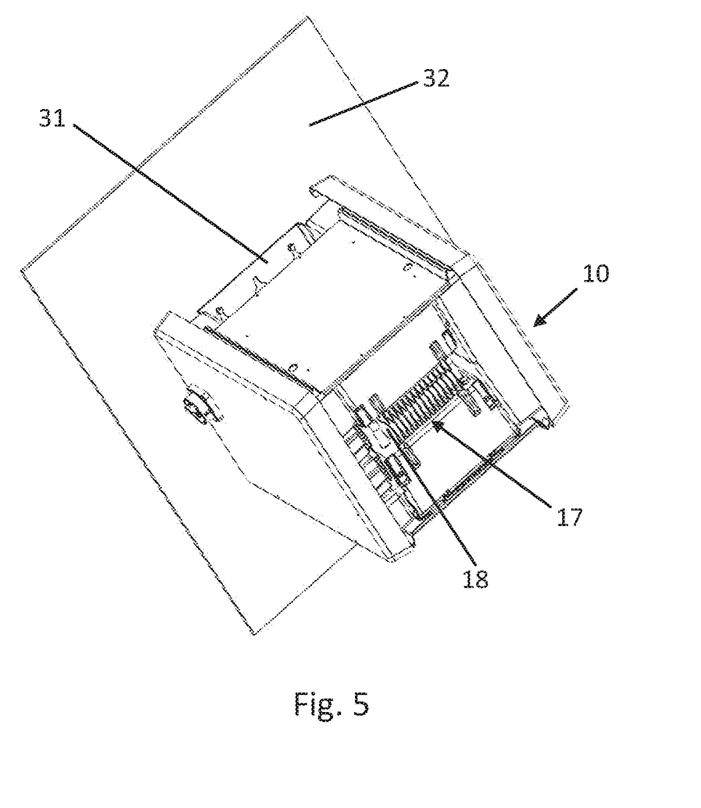
FIG. 5 shows an inverter according to the disclosure in a state in which it is mounted on a wall.

FIG. 5 shows an inverter 10 according to the disclosure in a mounting position on a wall 32. The inverter 10 has a positioning device 31 which is embodied in this embodiment as a wall securing means. For this purpose, the positioning device 31 can, on the one hand, be fastened to the mounting side already defined in conjunction with FIG. 3, for example by means of screws, and on the other hand fastened to the wall 32, for example screwed on by means of screws or engaged in hooks. The mounting side of the inverter 10 is therefore oriented parallel to the wall 32, and the cooling-air duct 17 is oriented perpendicular to the wall 32, with the result that a cooling-air stream flows through the heat sink 18 in a horizontal direction. Since no chimney effect, or only a small one, is to be expected in such a mounting position, forced ventilation can be provided which can comprise, in particular, a fan unit 29 according to FIG. 6. The direction of flow of the cooling-air stream can optionally be away from the wall or towards the wall.

Figure 6:
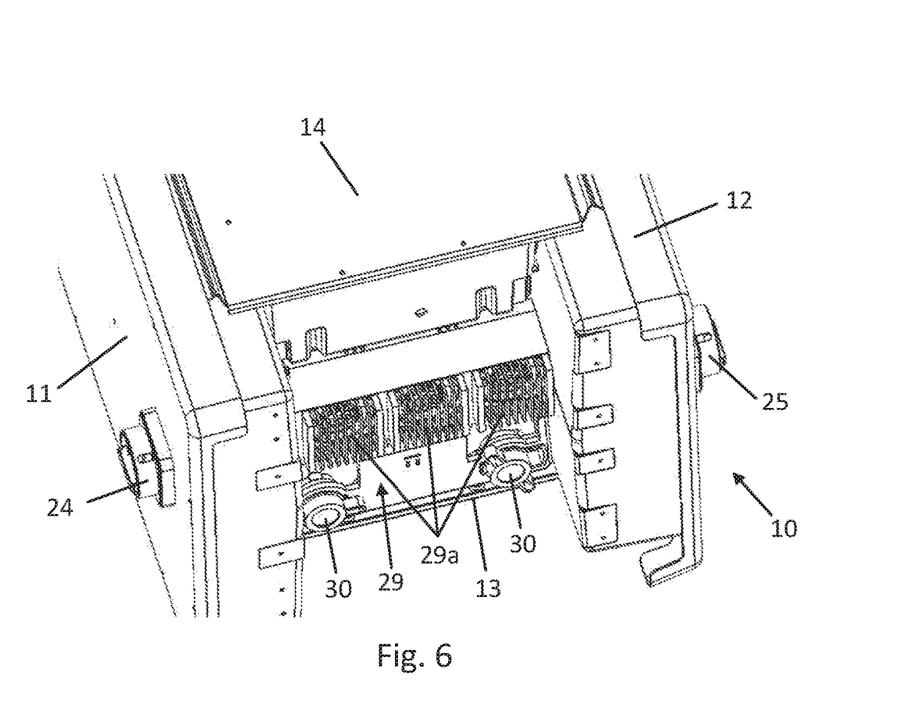
FIG. 6 shows a ventilator unit of an inverter according to the disclosure.

FIG. 6 shows a fan unit 29 of an inverter 10, wherein the fan unit 29 can have a plurality of fans 29a. The fan unit 29 is arranged in this embodiment of the inverter 10 on the mounting side of the inverter 10. Alternatively or additionally, a fan unit 29a can be mounted on the side of the inverter 10 which is opposite the mounting side. The fan unit 29 is mounted so as to be slideable in a direction perpendicular to the axis of the cooling-air duct 17, for example in that the fans 29a are arranged on a common securing plate which can be guided, in particular, by guides arranged on the rear sides of the housing parts 11 and 12 and/or on the underside of the housing part 13. Sliding of the fan unit can be releasably blocked by a locking device 30. The locking device 30 according to FIG. 6 has, for example, a rotatably mounted locking lever, wherein in the position illustrated to the left in FIG. 6 the locking device 30 blocks the sliding of the fan unit 29 in that the locking lever engages in a groove or behind an edge on the rear side of the housing part 13. In the position which is illustrated on the right in FIG. 6, the locking device 30 is not locked, with the result that this would basically permit sliding of the fan unit 29. The fan unit 29 can thus be removed, for example, for maintenance purposes or repair purposes without further parts of the inverter having to be disassembled.

Advantageous developments of the disclosure can be found in the patent claims, the description and the drawings. The advantages of features and of combinations of a plurality of features as mentioned in the description are merely by way of example and can come into effect alternatively or cumulatively without the advantages necessarily having to be achieved by embodiments according to the disclosure. Without the subject matter of the appended patent claims being changed by this, the following applies with respect to the disclosure content of the original application documents and of the patent: further features can be found in the drawings—in particular the presented geometries and the relative dimensions of a plurality of components with respect to one another and their relative arrangement and effective connection. The combination of features of different embodiments of the disclosure or of features of different patent claims is also possible in a way which differs from the selected back-references of patent claims and is herewith suggested. This also relates to features which are presented in separate drawings or which are mentioned in the description of said drawings. These features can also be combined with features of different patent claims. Likewise, features which are specified in the patent claims can also be dispensed with for further embodiments of the disclosure.

The features which are mentioned in the patent claims and the description are to be understood in terms of their number in such a way that precisely this number or a higher number than the specified number is present without the explicit use of the adverb "at least" being necessary. Therefore, if, for example, the text mentions one element, this is to be understood as meaning that precisely one element, two elements or more elements are present. Further features can be added to these elements, or said elements may be the only elements to which the respective method or respective device relates.

The invention claimed is:

1. An inverter for converting an input-end direct current into an output-end alternating current to be fed into an AC voltage supply system, comprising:
   a first housing part with direct current connections for receiving direct current lines of a direct current generator,
   a second housing part with alternating current connections for receiving alternating current lines of an AC voltage supply system,
   a third housing part for accommodating power-electronics components of a DC voltage converter,
   a fourth housing part for accommodating power-electronics components of an inverter bridge circuit,
   wherein the housing parts each have an essentially planar rear wall and are arranged in such a way that they enclose a cooling-air duct with an essentially rectangular cross section, wherein the first housing part is arranged opposite the second housing part and the third housing part is arranged opposite the fourth housing part,
   a heat sink, which has two essentially planar cooling faces opposite one another arranged in the cooling-air duct, wherein the cooling faces are assigned to the essentially planar rear walls of the third housing part and the fourth housing part and are in thermal contact with power-electronics components arranged in these housing parts.

2. The inverter according to claim 1, wherein a first part of a DC voltage intermediate circuit is arranged in the third housing part and a second part of a DC voltage intermediate circuit is arranged in the fourth housing part.

3. The inverter according to claim 2, wherein the first part and the second part of the DC voltage intermediate circuit are electrically connected to one another via intermediate circuit connecting lines which run within a tubular connecting duct between the third housing part and the fourth housing part, wherein an outer wall of the connecting duct is embodied in an electrically insulating fashion.

4. The inverter according to claim 3, wherein the connecting duct has at least two partial ducts for accommodating intermediate circuit connecting lines with a positive potential and a negative potential, wherein the partial ducts run axially along the connecting duct and are electrically insulated from one another by means of an axially running dividing wall.

5. The inverter according to claim 4, wherein the connecting duct has a third partial duct for accommodating intermediate circuit connecting lines with a center point potential of the DC voltage intermediate circuit, wherein the third partial duct runs axially along the connecting duct and is electrically insulated from the first and the second partial ducts by means of a further axially running dividing wall.

6. The inverter according to claim 2, wherein the intermediate circuit connecting lines are embodied without electrical insulation.

7. The inverter according to claim 2, wherein the connecting duct comprises two partial tubes, wherein in each case one partial tube extends into the third housing part and into the fourth housing part.

8. The inverter according to claim 1, wherein coiled wire products, which are embodied as filter chokes and/or as storage chokes and are configured for filtering or storing the direct current which is to be converted and/or the alternating current which has been converted, are arranged in the first housing part and/or in the second housing part.

9. The inverter according to claim 1, wherein a direct current circuit breaker is arranged in the first housing part and/or an alternating current circuit breaker is arranged in the second housing part.

10. The inverter according to claim 1, wherein the heat sink comprises a single-part or multi-part component which is separate from the housing parts, and comprises an extruded profile, wherein cooling faces of the heat sink which are opposite one another are fitted into corresponding cutouts in the rear walls of the third housing part and of the fourth housing part.

11. The inverter according to claim 1, wherein the heat sink is formed by cooling ribs, wherein the cooling ribs are arranged on the rear walls of the third housing part and of the fourth housing part which are opposite one another.

12. The inverter according to claim 1, wherein the inverter has at least one further heat sink which is arranged on the rear wall of the first housing part or of the second housing part and is configured to cool the coiled wire products which are arranged in the first housing part and/or the coiled wire products which are arranged in the second housing part, and is thermally connected to the cooling-air duct, with the result that the further heat sink outputs heat, which has been output by the coiled wire products, to cooling air which flows through the cooling-air duct.

13. The inverter according to claim 1, further comprising a fan unit configured to generate a stream of cooling air through the cooling duct, arranged at one end of the cooling-air duct.

14. The inverter according to claim 1, wherein the fan unit is configured to be slid in a direction perpendicular to the axis of the cooling-air duct, wherein the sliding is blocked in a releasable fashion by a locking device, such that the fan unit is removable from the inverter.

15. The inverter according to claim 1, further comprising a cover arranged on a side of the cooling-air duct which is opposite the fan unit.

16. The inverter according to claim 1, further comprising a positioning device provided on a mounting side of the inverter, wherein the mounting side of the inverter is oriented in a normal fashion with respect to the axis of the cooling-air duct.

17. The inverter according to claim 16, wherein the positioning device is configured for positioning the inverter in an upright fashion on an essentially horizontal face such that after the inverter has been mounted, the cooling-air duct is oriented vertically.

18. The inverter according to claim 16, wherein the positioning device is configured to suspend the inverter from a wall, with the result that after mounting, the mounting side of the inverter is oriented parallel with respect to the wall and the cooling-air duct of the inverter is oriented perpendicularly with respect to the wall.

* * * * *